US008001334B2

(12) United States Patent
Lee

(10) Patent No.: US 8,001,334 B2
(45) Date of Patent: Aug. 16, 2011

(54) BANK SHARING AND REFRESH IN A SHARED MULTI-PORT MEMORY DEVICE

(75) Inventor: Dongyun Lee, San Jose, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 781 days.

(21) Appl. No.: 11/952,052

(22) Filed: Dec. 6, 2007

(65) Prior Publication Data

US 2009/0150621 A1 Jun. 11, 2009

(51) Int. Cl.
*G06F 12/08* (2006.01)

(52) U.S. Cl. ................... 711/149; 711/E12.048
(58) Field of Classification Search .......... None
See application file for complete search history.

(56) References Cited

U.S. PATENT DOCUMENTS

| | | | | | |
|---|---|---|---|---|---|
| 4,745,545 | A | * | 5/1988 | Schiffleger | 711/150 |
| 5,463,590 | A | * | 10/1995 | Watanabe | 365/230.03 |
| 5,875,470 | A | * | 2/1999 | Dreibelbis et al. | 711/147 |
| 6,088,760 | A | | 7/2000 | Walker et al. | |
| 6,279,084 | B1 | * | 8/2001 | VanDoren et al. | 711/141 |
| 6,298,413 | B1 | * | 10/2001 | Christenson | 711/106 |
| 6,789,155 | B2 | * | 9/2004 | Jeddeloh | 711/5 |
| 7,107,386 | B1 | * | 9/2006 | Purcell et al. | 711/5 |
| 7,539,825 | B2 | * | 5/2009 | Sohn et al. | 711/149 |
| 7,596,666 | B2 | * | 9/2009 | Ahn et al. | 711/149 |
| 2005/0268050 | A1 | * | 12/2005 | Suh | 711/149 |
| 2006/0161338 | A1 | * | 7/2006 | Sohn et al. | 701/202 |
| 2006/0271724 | A1 | * | 11/2006 | Purcell et al. | 711/5 |
| 2006/0294322 | A1 | * | 12/2006 | Matsuzaki et al. | 711/149 |
| 2007/0022245 | A1 | * | 1/2007 | Sohn et al. | 711/106 |
| 2007/0070743 | A1 | | 3/2007 | Do et al. | |
| 2009/0059711 | A1 | * | 3/2009 | Oh et al. | 365/230.05 |
| 2009/0106503 | A1 | * | 4/2009 | Lee et al. | 711/149 |

OTHER PUBLICATIONS

"ISR WO Mailed Feb. 4, 2009 for PCT/US2008/083284", Whole Document.
International Preliminary Report on Patentability for International Patent Application No. PCT/US2008/083284 mailed Jun. 8, 2010.

* cited by examiner

*Primary Examiner* — Shane M Thomas
*Assistant Examiner* — Ryan Dare
(74) *Attorney, Agent, or Firm* — Blakely Sokoloff Taylor & Zafman

(57) ABSTRACT

A method and system for sharing banks of memory in a multi-port memory device between components is provided. The multi-port memory device includes multiple ports to which components of a system are attached, and multiple banks of memory within the multi-port memory device that are shared by each of the ports. A bank availability pin is added to each port for each bank of memory. The bank availability pin is signaled when the bank is available to a particular port and unsignaled when the bank is unavailable. Thus, the multi-port memory device can be shared by several components simultaneously with only a small amount of additional hardware to support the sharing. Also provided are methods for refreshing the banks of memory.

21 Claims, 3 Drawing Sheets

BANK SHARING AND REFRESH IN A SHARED MULTI-PORT MEMORY DEVICE

BACKGROUND

In computer hardware, shared memory typically refers to a large block of random access memory that can be accessed by several different central processing units (CPUs) or other components in a multiple-processor computer system. For example, mobile phones often contain a baseband processor, media processor, and LCD controller, each of which may share a common memory area. The components of a multiple-processor system often need to share information. For example, the media processor of a mobile phone may run an operating system that interacts with the baseband processor to make a telephone call. As another example, the media processor may write information into a frame buffer of the LCD controller that describes an image to be displayed. The information sharing between components typically requires many different control and data interfaces. Control and data interfaces may be defined between each of the components and between the components and the shared memory. Moreover, there may be additional interfaces between each component using the shared memory for coordinating accesses of the shared memory.

In a typical memory device containing dynamic random access memory (DRAM), a component accessing the memory sends an activate (ACT) command to begin using the memory device. Memory is typically accessed by providing a row and column address, and a row address may accompany the ACT command. The ACT command causes the specified row of memory to be cached in a buffer where subsequent read commands can access (e.g., read and write) various columns of the memory data. When the component is finished with the data in the row, the component typically issues a precharge (PCG) command that causes the row data to be written back to the memory bank. This cycle repeats as the component accesses additional rows of the memory data.

One problem with a shared memory device is that components in a multi-processor architecture often need to share banks within the shared memory device. For example, one bank may be assigned to one component to complete a task and then another component when the task is complete. As another example, the components may use a bank to share information between components, and may need to coordinate so that each component can detect when it is safe to access the memory. If two components attempt to write to the memory at the same time data corruption can result by one component overwriting the information written by the other component. Similarly, if one component writes information for sharing with another component to the memory and the other component reads from the memory too soon, the reading component will read old information. There is therefore a need for an improved method of sharing banks of memory.

DETAILED DESCRIPTION

Figure 1:
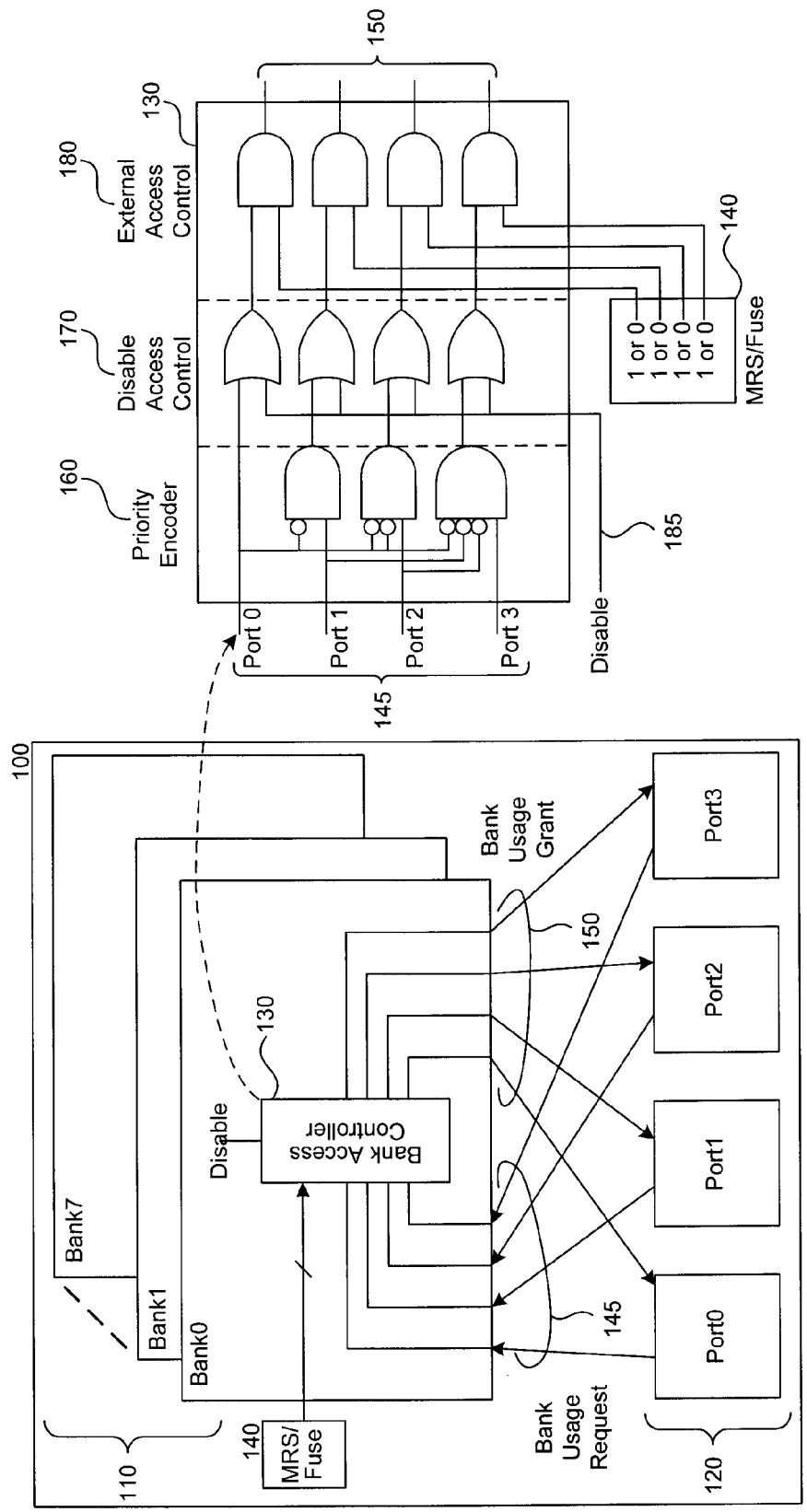
FIG. 1 is a block diagram that illustrates components of a multi-port memory device.

A method and system for sharing banks of memory between components is provided. The multi-port memory device includes multiple ports to which components of a multiprocessor system are attached, and one or more banks of memory within the multi-port memory device that are shared by each of the ports. A bank provides an indication to each port that indicates whether the bank is available for use. For example, the bank may provide a bank availability hardware pin that is signaled when the bank is available to a particular port and unsignaled when the bank is unavailable. Alternatively, the bank may provide the bank availability indication through standard pins of the memory device (e.g., data pins). When a component attached to a port wants to use a bank of memory, the component determines if the bank is available by inspecting the bank availability indication. If the bank availability indication indicates that the bank is available, the component sends a request to reserve the bank of memory, such as through an input control pin. For example, the request to reserve a bank of DRAM may be included with a DRAM ACT command. When the bank receives the bank reservation request, the bank modifies the bank availability indication for each of the ports. For the port that sent the reservation request, the bank availability indication continues to indicate that the bank is available. However, for each of the other ports, the bank availability indication indicates that the bank is in use, effectively reserving the bank for the exclusive use of the component that issues the bank reservation request. Then, the component that issued the bank reservation request can read and write to the memory bank. When the component is done using the memory bank, the component sends a bank release command (e.g., by unsignaling the input control pin) to relinquish the reservation of the bank. For example, the request to release the bank may be included with a DRAM PCG command. Then, the memory bank modifies the bank availability indication to indicate that the bank of memory is once again available for use by any of the ports. Thus, the multi-port memory device can be shared by several components simultaneously with only a small amount of additional hardware to support the sharing.

Bank Access Control

In some embodiments, the multi-port memory device establishes a priority between ports that is used when two components simultaneously attempt to reserve a bank by sending an ACT command. For example, both components may inspect the availability pin and determine that the bank is available, and both may send an ACT command attempting to reserve the bank. The multi-port memory device will grant a reservation to the port having the higher priority. The components can use the availability pin to determine if the reservation request was successful. The component that had the higher priority will have a bank availability pin set to one, while the component having the lower priority (and each of the other ports) will have a bank availability pin set to zero.

Those of ordinary skill in the art will recognize that common synchronization constructs, such as mutexes and semaphores, can be built using the bank availability pin. A component issues an ACT command optimistically testing the availability of the bank. If the bank is available, then the ACT command succeeds and the bank availability pin indicates that the component has a reservation to access the bank of memory. If the ACT command fails (e.g., because the bank is already reserved), then the bank availability pin indicates that the bank is not available, and the component can periodically poll the bank by sending additional ACT commands to determine when the bank is available. As an optimization, the component can also wait for the bank availability pin to indicate that the bank is no longer reserved before sending additional ACT commands.

In some embodiments, the multi-port memory device provides electronic fuses for determining which components can access each bank of memory. An electronic fuse is a fuse that can be blown by sending an electronic signal to a device. Many electronic fuses cannot be reset once blown, making them an effective tool for preventing software tampering with hardware configuration. For example, by blowing certain electronic fuses an application may configure the multi-port memory device such that the bank availability pin always indicates availability to one port and always indicates unavailability to the other ports. Such a configuration may be performed as part of the manufacturing process or in the field after the memory device has been incorporated in a particular application. In some applications, it is desirable to ensure that some components cannot access banks of memory used by other components to enforce a form of hardware firewall between the components. For example, mobile phones often are designed to protect the memory used by a baseband processor that communicates with the mobile phone provider's network, from erroneous behavior of a media processor, which runs an operating system that presents the user interface to the mobile phone user. This type of design prevents errors in the operating system software from affecting the provider's network such as could occur if invalid data were sent over the provider's network. By blowing certain electronic fuses, the media processor can be prevented through hardware from accessing memory banks used by the baseband processor.

In some embodiments, the multi-port memory device provides a mode set register (MRS) that an application can use to dynamically change the configuration of the availability of a bank of memory. Unlike an electronic fuse that generally cannot be reset once it is blown, the MRS can be set repeatedly by software to modify the configuration of the multi-port memory device over time. To provide both hardware-locked configuration and resettable configuration in the same device, a master electronic fuse can be used to determine whether the current configuration is set by the mode set register or by other electronic fuses. When an application requires a hardware-locked configuration, the application can blow the master electronic fuse so that the configuration of the other electronic fuses will control the configuration of the device, and software can be prevented from making additional changes to the configuration. When an application requires a resettable configuration, the master fuse is not blown and the configuration data in the MRS controls the configuration of the device.

FIG. 1 is a block diagram that illustrates components of a multi-port memory device 100 in one embodiment. The multi-port memory device 100 contains one or more banks of memory 110, one or more serial ports 120, one or more bank access controllers 130 associated with each of the banks of memory, one or more electronic fuses 140, input control pins 145, and output control pins 150. The banks of memory 110 are typically banks of dynamic random access memory (DRAM), which may vary in size and are shared by the ports 120. Ports 120 are serial ports that allow data to be transmitted to and received from components (not shown) that are coupled to the ports. The bank access controllers 130 determine which ports can access which banks of memory at any particular time. In some embodiments, a bank access controller 130 is associated with each bank of memory 110 and handles bank access requests for that bank. When a component attached to a port wants to reserve a bank of memory, the component sends a bank usage request (e.g., an ACT command) over the input control pins 145. The bank access controller 130 associated with the particular bank of memory determines how to respond to the request, and replies using the output control pins 150 with either a bank usage grant or denial.

The bank access controller 130 allows three options for bank access control: no control, control by configuration, and priority-based control. The no control option means that access to the associated bank is not regulated by the memory device. The no control option relies on external coordination among multiple components or port masters to manage access to the bank. In some embodiments, the no control option may be selected by asserting a bypass access control signal. The control by configuration option means that access to the bank is limited based on a configuration of the memory device. Control by configuration uses either an electronic fuse or a mode register to assign bank access rights to each port. Another fuse may be used to select whether assignments occur by fuse or mode register. The priority-based control option means that exclusive usage rights are granted to a port based on a priority established among competing ports.

In FIG. 1, each bank access controller 130 contains internal logic that determines whether a bank usage request will be granted or denied for the associated bank. Specifically, the bank access control includes: 1) a priority encoder 160 that determines a priority among the ports, 2) a disable access control 170 that allows the associated bank of memory to be disabled from access, and 3) an external access control 180 that responds to the settings of configuration data (e.g., a mode register set (MRS) and/or one or more electronic fuses 140). The priority encoder 160 establishes a priority among the ports such that a higher priority component that makes a simultaneous request to access a bank of memory will be granted access over a lower priority component. The priority encoder operation depends on higher priority components being connected to lower numbered ports (e.g., port0, port1) than lower priority components which are connected to higher numbered ports (e.g., port2, port3). The disable access control allows the corresponding bank to be disabled by the application of a single disable control signal applied on line 185. The external access control 180 allows certain ports to be prevented from accessing the corresponding bank of memory. The state of the external access control is dependent on configuration data that is applied to the access control. Such configuration data may come from the settings of the MRS or one or more fuses 140. The state of the MRS or fuses 140 are applied to the logic forming the external access control, allowing access to the corresponding bank to be denied to one or more of the ports until the state of the MRS or fuses is changed. For example, as described herein, it may be desirable in some applications to prevent one component from accessing memory used by another component at a hardware level. This can be used to prevent software errors from causing memory corruption across components. The combination of the bank access request applied to the bank access controller 130, as well as the state of the disable signal and the MRS or fuses, determines whether a bank is indicated as being available for access or not available for access on control and data interfaces 150. In some embodiments, a master electronic fuse (not shown) determines whether the MRS or electronic fuses are used to determine the configuration.

Figure 2:
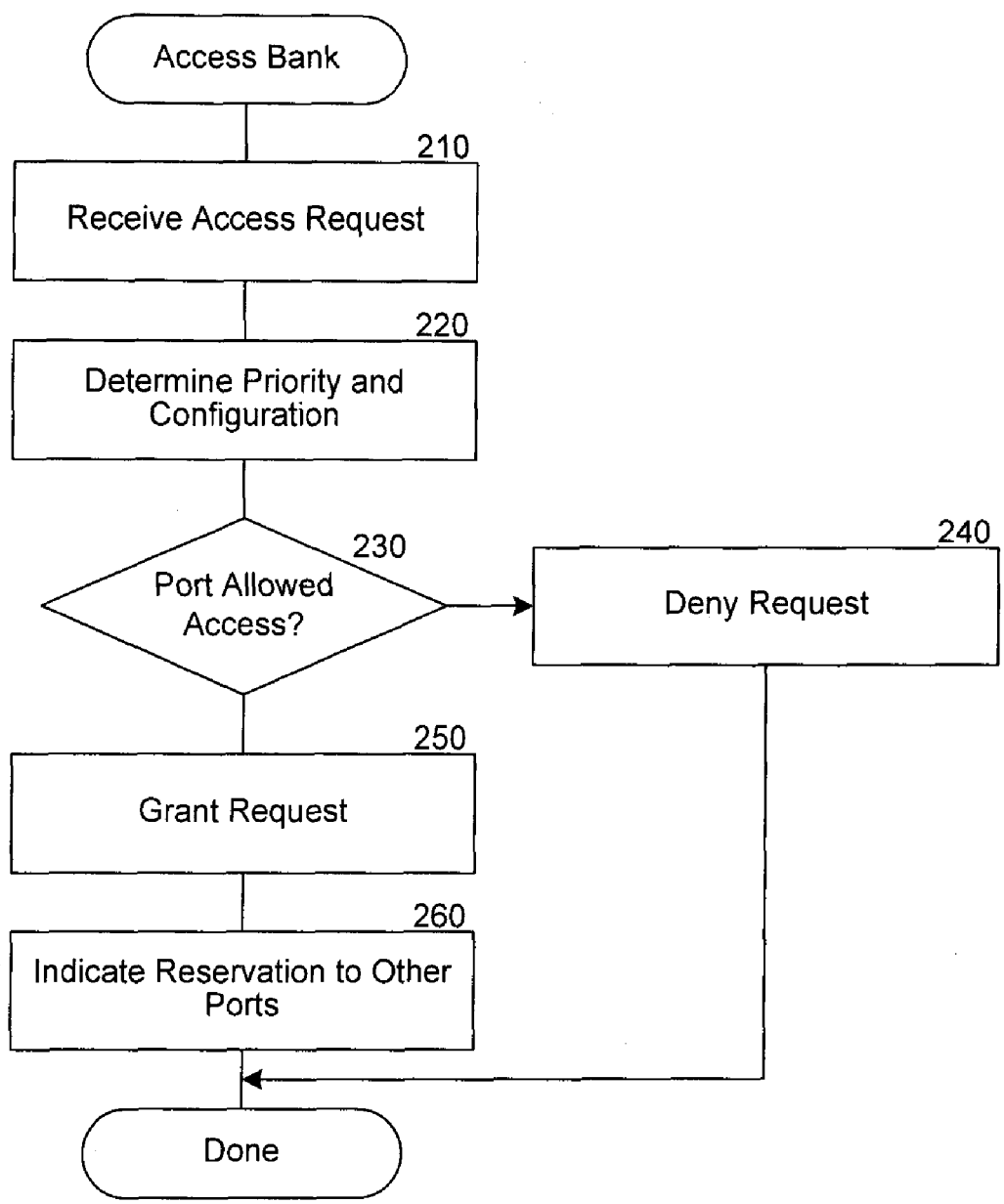
FIG. 2 is a flow diagram that illustrates the processing of a bank access controller of the multi-port memory device.

FIG. 2 is a flow diagram that illustrates the processing of one of the bank access controllers 130 of the multi-port memory device. In block 210, the controller receives a request to access a bank of the multi-port memory device from a component attached to one of the ports. In block 220, the controller determines the priority and configuration established for the particular port. The determination may include inspecting a priority table, reading the values of one or more electronic fuses, and so forth, to determine whether the requesting port is allowed to access the bank of memory at the current time. In decision block 230, if the port is not allowed to access the bank, then the bank access controller continues at block 240 and denies the access request, else the controller continues at block 250. In block 250, the controller grants the access request and the component attached to the port can begin reading and writing to the memory. In block 260, the bank access controller provides an indication to components attached to other ports that the bank is reserved and not currently available. After block 260, these steps conclude.

Based on the access control scheme being used, it is possible that a component attempting to use a bank of memory will be denied access to the bank of memory. When a component is denied access, the multi-port memory device may send a message to the component indicating that access was denied. The component may handle the message by completing any ongoing read burst and then reissuing the failed command later. For example, a component may repeatedly poll a particular bank until it is available by reissuing a command to access the bank until the command succeeds.

Refresh Timing

Figure 3A:
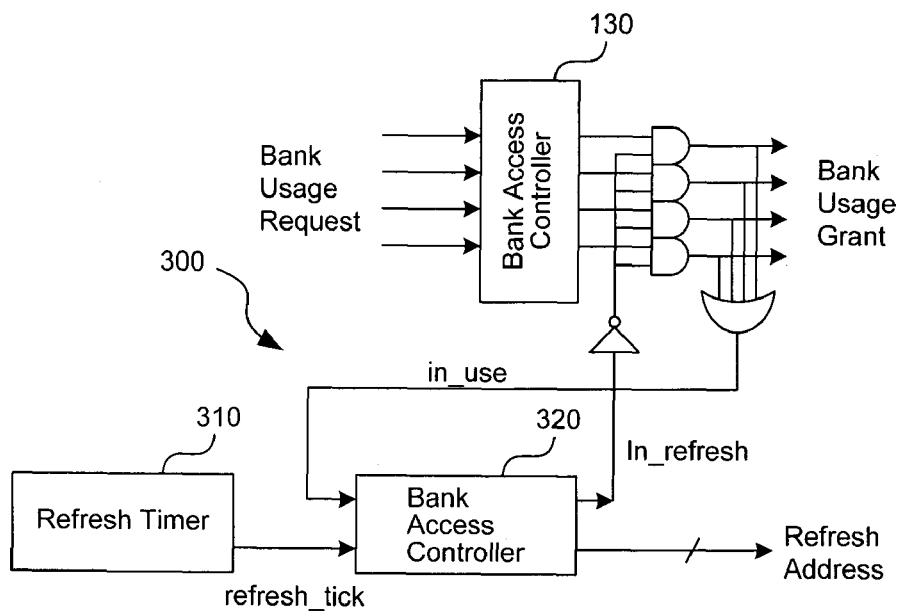
FIG. 3A is a block diagram that illustrates a bank refresh control module.

The DRAM banks 110 contained in the multi-port memory device 100 typically have specific timing considerations that govern the way in which the DRAM can be accessed. For example, the DRAM may have the following timing parameters:

FIG. 3A is a block diagram that illustrates a bank refresh control module 300. The multi-port memory device uses the bank refresh control module 300 to temporarily prevent access to memory banks during a refresh cycle (hereinafter referred to as a "local refresh"). The module comprises a refresh timer 310 coupled to a bank refresh controller 320. The refresh controller 320 is coupled to the DRAM memory banks, and can issue refresh signals to refresh the memory when the memory is not in use. In operation, the refresh timer 310 periodically issues a refresh_tick signal. The refresh_tick signal indicates that a bank refresh must be performed, and can be generated globally for all banks in the multi-port memory device or generated locally for each bank within the device. The bank refresh controller 320 receives the refresh_tick signal and determines whether the bank is in use by logically OR-ing the bank usage grant signals from the bank access controller 130. If the bank is not in use the bank refresh controller 320 generates refresh signals to refresh the bank. The bank refresh control 320 also generates a logic "1" signal, in_refresh, which is inverted and combined through a logical AND with the bank usage grant signals of the bank access controller 330 to prevent access to the bank of memory when a refresh operation is in progress. Any attempt to access the bank during a refresh operation will cause an access denied message to be sent to the requesting component, and the component will typically retry the access attempt later after which the refresh may have completed. When the refresh

| | |
|---|---|
| Commands Per Clock (CPC)/Command Rate | The amount of time in cycles between when a chip select is executed and commands can be issued. |
| Row Cycle Time (tRC) | The minimum time in cycles that it takes a row to complete a full cycle. If tRC is set too short, it can cause corruption of data, and if it is set too long, it will cause a loss in performance but increased stability. |
| Row to Row Delay (tRRD) | The amount of cycles that it takes to activate the next row of memory. The lower the timing, the better the performance, but low tRRD values can cause instability. |
| Row Refresh Cycle (tRFC) | The amount of cycles it takes to refresh a row on a memory bank. If tRFC is set too short, it can cause corruption of data and if it is set too long, it will cause a loss in performance, but increased stability. |
| Write Recovery Time (tRW) | The amount of time in cycles required after a valid write operation and precharge to insure that data is written properly. |
| Read to Write Delay (tRTW) | When a write command is received, the amount of time in cycles for the command to be executed. |
| Write to Read Delay (tWTR) | The amount of time in cycles required between a valid write command and the next read command. A lower tWTR offers better performance, but can cause instability. |
| Refresh Time (tREF) | The maximum number of cycles before a memory cell needs to be refreshed so that it does not lose its charge and become corrupt. |

The multi-port memory device 100 must observe any timing considerations required by the DRAM to ensure a consistent memory state. When the bank of memory is shared among multiple components, one component using the bank may not know what another component has done with the bank. This can make it difficult, for example, to ensure that a sufficient read to write delay has elapsed or that a sufficient refresh interval has been maintained. In addition, components typically are responsible for sending an auto refresh command (REFA) that refreshes the banks of the multi-port memory device after certain types of commands. However, when multiple components are using the memory device, a REFA command received on one port could conflict with access to another port. Therefore, in some embodiments the multi-port memory device 100 employs its own automatic or local refresh scheme described herein.

operation is completed, the bank refresh controller 320 sets the in_refresh signal to logic "0" to enable normal action of the bank access controller 130. If the bank is in use when the bank refresh controller 320 receives the refresh_tick signal, the bank refresh controller waits for the bank to no longer be in use before completing the refresh operation.

Figure 3B:
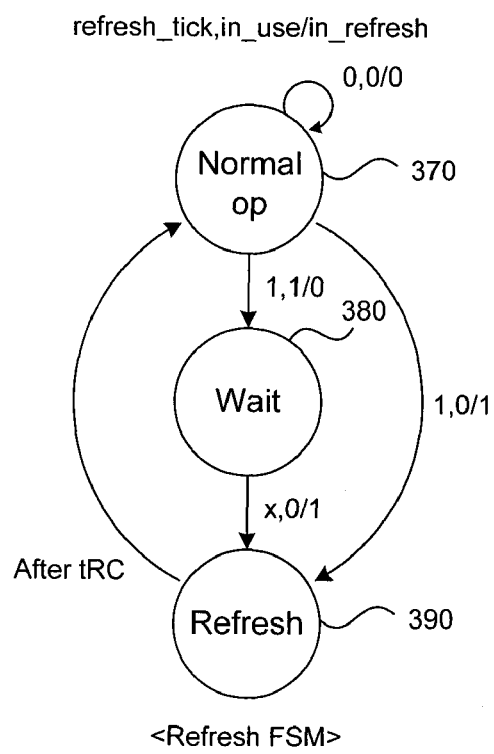
FIG. 3B is a state diagram that illustrates the states of the bank refresh control module of FIG. 3A.

FIG. 3B is a state diagram that illustrates the states of the bank refresh control module 300 of FIG. 3A. In the normal state 370, the refresh_tick, in_use, and in_refresh lines are not signaled and normal memory operations are permitted. If the refresh_tick line becomes signaled and the bank of memory is not in use, the state changes to the refresh state 390. If the bank of memory is in use, the state changes to the wait state 380 to wait for the in_use line to become unsignaled when the operation using the bank of memory completes. Then, the state changes to the refresh state 390. At the refresh state, the bank refresh control module completes a refresh operation. After the refresh operation is complete, designated by the passage of tRC, the state returns to the normal state 370 and components can once again perform memory operations using the bank.

In some embodiments, the refresh timer 310 of FIG. 3A is replaced by a command decoder that automatically determines when a refresh is needed based on the types of commands issued to the bank. This scheme, called an auto refresh scheme, requires more hardware, but allows components to use the bank of memory with fewer refresh delays.

In some embodiments, the multi-port memory device is architected to reduce the time required between operations that access the DRAM. For example, the column width may be constrained to relieve energy for bank activation. The multi-port memory device may also use separate voltage generators per bank to remove constraints such as tRRD and tFAW. Those of ordinary skill in the art will recognize that these and other designs can be used to reduce contention between multiple components sharing a bank of memory.

CONCLUSION

From the foregoing, it will be appreciated that specific embodiments of the multi-port memory device have been described herein for purposes of illustration, but that various modifications may be made without deviating from the spirit and scope of the invention. For example, although processing components have been described as being attached to the multi-port memory device for sharing memory, many types of components can be attached to the multi-port memory device. For example, sound hardware, LCD screens, video hardware, controller modules, digital signal processors, and many other types of components can share memory using the multi-port memory device and the methods described herein. As another example, although DRAM has been described, the methods described herein can be used with other types of memory such as static random access memory (SRAM), flash memory, and so on. Accordingly, the invention is not limited except as by the appended claims.

I claim:

1. A method in a multi-port memory device for sharing banks of memory, the method comprising:
    receiving a request on a first port to access one of a plurality of banks of memory in a memory device having a plurality of ports;
    determining if the requested bank of the plurality of banks of memory is available, wherein determining if the requested bank of memory is available includes determining to which of a plurality of options bank access control is set, the plurality of options for bank access control including priority-based control, no control, and control by configuration;
    if the requested bank is available, granting to the first port access to the requested bank of memory; and
    upon granting access to the first port, providing an indication to other ports that the requested bank of memory is reserved by the first port;
    wherein:
        when the bank access control is set to control by configuration, then determining if the requested bank of memory is available including inspecting configuration data related to the requested bank of memory, and
        when the bank access control is set to priority control, then determining if the requested bank of memory is available comprises determining the priority of the first port relative to the other ports of the multi-port memory device.

2. The method of claim 1 wherein the bank access control is set to no control if a bypass access control signal is set for the bank, wherein the bypass access control signal allows a plurality of components to share the bank of memory using external coordination.

3. The method of claim 1, wherein:
    if a master electronic fuse is not blown, then the configuration data for the bank of memory is reflected by the status of a mode set register, the mode set register being resettable by software; and
    if the master electronic fuse is blown, then the configuration data for the bank of memory is reflected in a set of electronic fuses, the electronic fuses being non-resettable after the electronic fuses are blown.

4. The method of claim 1 wherein determining if the bank of memory is available further comprises determining a refresh state of a finite state machine associated with the bank of memory, wherein the multiport device is to prevent access to the requested bank of memory during a refresh cycle.

5. The method of claim 1, further comprising receiving a request on the first port to release the bank of memory.

6. The method of claim 5 wherein the request on the first port to release the bank of memory is a DRAM precharge request.

7. The method of claim 1 wherein the request on the first port to access the bank of memory is a DRAM activate request.

8. The method of claim 1 wherein providing an indication to other ports that the requested bank of memory is reserved by the first port comprises modifying a bank availability signal.

9. A multi-port memory device for sharing banks of memory among ports attached to one or more component devices, the multi-port memory device comprising:
    a plurality of banks of memory;
    a plurality of ports coupled to the plurality of banks of memory; and
    a bank access controller coupled to the plurality of ports and configured to determine whether a component coupled to one of the plurality of ports can access one of the plurality of banks of memory based on an access request received on the port from the component, wherein the bank access controller is set to one of a plurality of options for bank access control, the plurality of options including priority-based control, no control, and control by configuration, the bank access controller including:
        a priority encoder to determine a priority among ports for priority-based control,
        a disable access control to allow the bank of memory to be disabled from access, and
        an external access control that responds to settings of configuration data for control by configuration of the bank of memory.

10. The system of claim 9 wherein if the bank access controller is set to priority-based control, the bank access controller determines whether the component can access the bank of memory based on the priority of the port for the component requesting access to the bank of memory relative to other ports of the multi-port memory device.

11. The system of claim 9 wherein the bank access controller denies access to the bank of memory if the disable access control is set for the bank.

12. The system of claim 9, further comprising for the bank of memory:
   a master electronic fuse;
   and a set of electronic fuses; and
   a mode set register.

13. The system of claim 12, wherein:
   if the master electronic fuse is not set, then the configuration data is reflected by the status of a mode set register, the mode set register being resettable by software; and
   if the master electronic fuse is set, then the configuration data is reflected in a set of electronic fuses, the electronic fuses being non-resettable after the electronic fuses are blown.

14. The system of claim 9 further comprising a bank availability pin associated with each of the plurality of banks of memory, wherein the component ascertains the value of the bank availability pin before sending the access request.

15. The system of claim 9 further comprising a bank availability pin associated with each of the plurality of banks of memory, wherein the bank access controller determines the success of the access request by ascertaining the value of the bank availability pin after receiving the access request.

16. A method of synchronizing accesses by one or more components to a shared bank of memory in a memory device, the method comprising:
   determining whether a bank availability signal indicates that a bank of memory in a memory device containing a plurality of memory banks is available, wherein determining if the requested bank of memory is available includes determining to which of a plurality of options bank access control is set, the plurality of options for bank access control including priority-based control, no control, and control by configuration;
   if the bank availability signal indicates that the bank of memory is available, sending a bank reservation request to the memory device;
   inspecting the bank availability signal to determine whether the bank reservation request was successful; and
   if the bank reservation request was successful, accessing the bank of memory;
   wherein:
      when the bank access control is set to control by configuration, then determining if the requested bank of memory is available including inspecting configuration data related to the requested bank, and
      when the bank access control is set to priority control, then determining if the requested bank of memory is available comprises determining the priority of the first port relative to the other ports of the multi-port memory device.

17. The method of claim 16 wherein, after a component has successfully reserved the bank of memory, subsequent requests by other components to reserve the bank of memory receive an indication that the bank of memory is unavailable.

18. The method of claim 16 wherein the bank availability signal provides a semaphore for synchronizing access by the one or more components.

19. The method of claim 16 wherein the bank availability signal is provided through standard pins of the memory device.

20. A method of refreshing a bank of memory in a shared memory device having multiple banks of memory, the method comprising:
   receiving a request to refresh one of the multiple banks of memory;
   determining whether the bank of memory is in use, wherein determining if the requested bank of memory is in use includes determining to which of a plurality of options bank access control is set, the plurality of options for bank access control including priority-based control, no control, and control by configuration;
   when the bank of memory is in use, waiting for the bank of memory to be available; and
   upon the bank of memory being available, refreshing the bank of memory, wherein each bank of memory of the multiple banks of memory is refreshed at times based on a usage pattern of each bank of memory;
   wherein:
      when the bank access control is set to control by configuration, then determining if the requested bank of memory is available including inspecting configuration data related to the requested bank of memory, and
      when the bank access control is set to priority control, then determining if the requested bank of memory is available comprises determining the priority of the first port relative to the other ports of the multi-port memory device.

21. The method of claim 20, including:
   receiving a request to access the bank of memory;
   determining whether the bank of memory is being refreshed; and
   when the bank of memory is being refreshed, denying the request to access the bank of memory.

* * * * *